US006670093B2

(12) United States Patent
Song et al.

(10) Patent No.: US 6,670,093 B2
(45) Date of Patent: Dec. 30, 2003

(54) SILICON-CONTAINING COPOLYMER AND PHOTOSENSITIVE RESIN COMPOSITION CONTAINING THE SAME

(75) Inventors: Tsing-Tang Song, Ilan Hsien (TW); Tsong-Shin Jean, Hsinchu Hsien (TW); Weir-Torn Jiaang, Taipei (TW); Chih-Shin Chuang, Chunghua (TW); Han-Bin Cheng, Kaohsiung (TW); Jui-Fa Chang, Hsinchu (TW); Tzu-Yu Lin, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 201 days.

(21) Appl. No.: 09/858,697

(22) Filed: May 16, 2001

(65) Prior Publication Data

US 2002/0177066 A1 Nov. 28, 2002

(30) Foreign Application Priority Data

Apr. 6, 2001 (TW) ........................ 90108274 A

(51) Int. Cl.⁷ ..................... G03F 7/004; C08F 30/08
(52) U.S. Cl. .................. 430/270.1; 430/905; 430/914; 430/921; 526/271; 526/279; 526/281
(58) Field of Search ................... 526/281, 279, 526/271; 430/270.1, 914, 921, 905

(56) References Cited

U.S. PATENT DOCUMENTS 6,165,678 A * 12/2000 Allen et al. .............. 430/270.1
6,444,408 B1 * 9/2002 Brock et al. ................ 430/322
6,506,535 B1 * 1/2003 Mizutani et al. ......... 430/270.1

FOREIGN PATENT DOCUMENTS

JP 2001-125272 * 5/2001

OTHER PUBLICATIONS

Chemical Abstract AN 2001:336598 of JP 2001–125272, May 2001.*

* cited by examiner

Primary Examiner—Rosemary Ashton
(74) Attorney, Agent, or Firm—Darby & Darby

(57) ABSTRACT

The present invention relates to a silicon-containing copolymer which includes a maleic anhydride repeating unit, a norbornene repeating unit, and at least one silicon group-containing norbornene repeating unit. The silicon-containing copolymer is suitable for use as a top layer resist in a bilayer resist system.

24 Claims, No Drawings

SILICON-CONTAINING COPOLYMER AND PHOTOSENSITIVE RESIN COMPOSITION CONTAINING THE SAME

BACKGROUND OF THE INVENTION

1. Field of the Invention

The present invention relates to a silicon-containing copolymer, and more particularly to a photosensitive resin composition containing the silicon-containing copolymer. The silicon-containing copolymer is suitable for use as a top layer resist in a bilayer resist system.

2. Description of the Prior Art

With increasing integration of semiconductor devices, there is a heightened need to form finer patterns in photolithography processes. Both 248 nm and 193 nm photolithography technologies are necessitated in fabricating microelectronic devices, and many efforts have been made to develop a suitable photoresist material for operating at such short wavelengths.

When a single layer resist is used in short wavelength photolithography, even if an anti-reflection resist layer is applied, the depth of focus (DOF) will be decreased, and the stability control capacity of the process also decreases. Therefore, a bilayer resist has been developed to improve the resolution and the stability control capacity of the process. The bilayer resist includes a thicker underlayer of resin, which can planarize the substrate and decrease reflection, and a thinner silicon-containing top layer of a silicon-containing polymer, which is photosensitive and has good resistance to oxygen plasma etching.

Most of the silicon-containing polymer resists used in 193 nm bilayer resist are acrylate-based resins. The disadvantages follow. The acrylate-based resin is labile on the backbone. When the silicon content increases, the Tg of the resin decreases accordingly. In addition, since the acrylate-based resin is lacking in functional groups with high polarity, it has poor adhesion to the resin underlayer. Once a polar group is introduced into the acrylate-based resin, swelling occurs, which results in poor resolution. In addition, the acrylate-based resin has poor erosion resistance.

Therefore, in recent years, many researchers have attempted to develop new silicon-containing polymers for use as the top layer resist in the bilayer resist system. Boardman et al. [SPIE 3678, 562(1999)], Sooriyakumaran et al. [SPIE 3999, 128(2000)] and Kim et al. [SPIE 3999, 115(2000)] have all synthesized silicon-containing copolymers of maleic anhydride and norbornene. Since maleic anhydride and norbornene have more rigid structures than acrylate, the Tg of the resin is increased. In addition, the high polarity of maleic anhydride can enhance the adhesion between the resist top layer and the resin underlayer.

However, there is still a need to develop a novel silicon-containing copolymer suitable for a bilayer resist system, in order to further enhance the Tg of the resist resin system and the adhesion.

SUMMARY OF THE INVENTION

Therefore, an object of the present invention is to solve the above-mentioned problems and to provide a novel silicon-containing copolymer having a high glass transition temperature and a better polarity.

Another object of the present invention is to provide a novel silicon-containing copolymer having good adhesion to a resin underlayer for use in a bilayer resist system.

To achieve the above objects, the silicon-containing copolymer of the present invention includes a repeating unit represented by formula (I), a repeating unit represented by formula (VI), a repeating unit represented by a formula selected from the group consisting of formulae (II), (III), (IV), (V), and mixtures thereof:

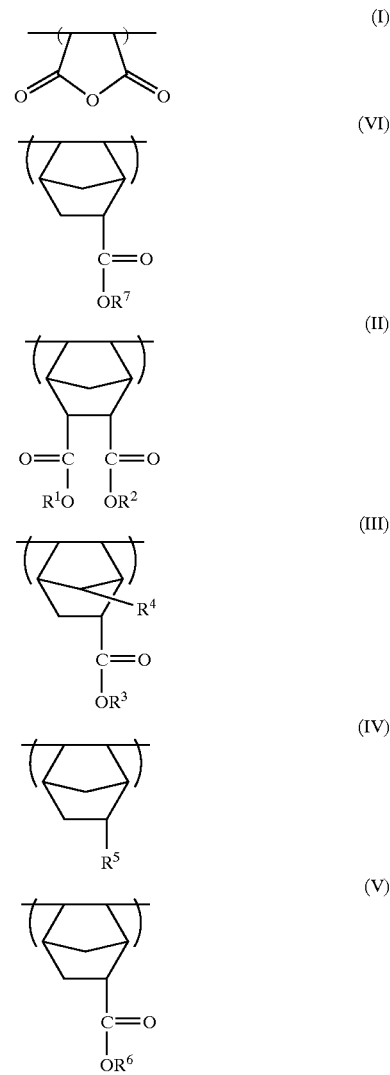

wherein
$R^7$ is selected from the group consisting of hydrogen, $C_{1-20}$ linear and branched alkyl, ($C_{1-6}$alkoxy) ($C_{1-10}$ alkyl), ($C_{3-20}$cycloalkyl) ($C_{0-6}$alkyl), ($C_{3-20}$ polycycloalkyl) ($C_{0-6}$alkyl), and ($C_{3-10}$heterocyclic group) ($C_{0-6}$alkyl), $R^1$, $R^2$, and $R^3$ can be the same or different and are independently selected from the group consisting of hydrogen, $C_{1-20}$ linear and branched alkyl, ($C_{1-6}$alkoxy) ($C_{1-10}$alkyl), ($C_{3-20}$cycloalkyl) ($C_{0-6}$alkyl), ($C_{3-20}$polycycloalkyl) ($C_{0-6}$alkyl), ($C_{3-10}$heterocyclic group) ($C_{0-6}$alkyl), and a silicon-containing group, wherein the silicon-containing group is $C_{3-50}$ silyl or ($C_{3-50}$silyl) ($C_{1-9}$alkyl), and the silyl can be substituted with an alkoxy substituent, and wherein at least one of $R^1$ and $R^2$ is the silicon-containing group, $R^4$, $R^5$, and $R^6$ can be the same or different and are independently the silicon-containing group, and the moles of formula (I), the moles of formula (VI), and the sum of the moles of formulae (II), (III), (IV), and (V) are in a ratio of 1:0.05–0.8:0.2–0.95.

DETAILED DESCRIPTION OF THE INVENTION

The silicon-containing copolymer of the present invention can be prepared from the corresponding repeating units by any suitable conventional polymerization method, such as, free radical, controlled radical or group transfer polymerization.

As mentioned above, the silicon-containing copolymer of the present invention includes at least three repeating units. The maleic anhydride repeating unit of formula (I) and the norbornene repeating unit of formula (VI) are necessary components for the silicon-containing copolymer of the present invention. Another component is at least one of the norbornene repeating units, having a silicon-containing group, represented by formulae (II), (III), (IV), and (V).

Formula (VI) is a repeating unit containing no silicon. Formulae (II), (III), (IV), and (V) are repeating units containing silicon.

The silicon-containing group indicated in the present invention is $C_{3-50}$ silyl or ($C_{3-50}$ silyl) ($C_{1-9}$ alkyl), wherein the silyl can be substituted with an alkoxy substituent. According to the present invention, at least one of $R^1$ and $R^2$ in formula (II) is the silicon-containing group, $R^3$ in formula (III) can be the silicon-containing group, $R^4$ is the silicon-containing group, and $R^5$ in formula (IV) and $R^6$ in formula (V) are the silicon-containing groups.

For example, the silicon-containing group can be selected from the group consisting of

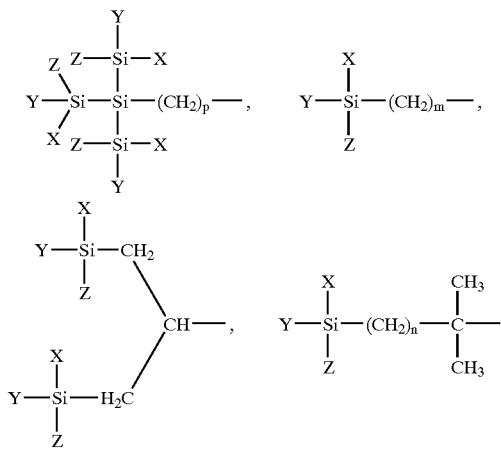

wherein

X, Y, and Z can be the same or different and are independently selected from the group consisting of $C_{1-4}$ linear and branched alkyl, and $C_{1-6}$ alkoxy, m, n, and p are 0 or integers of from 1 to 6.

A preferred example of the silicon-containing group is when X, Y, and Z are the same and are methyl or methoxy.

Representative examples of the silicon-containing groups include

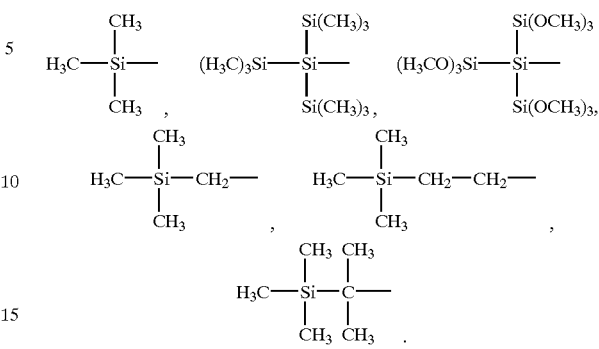

A representative example of formula (VI) is

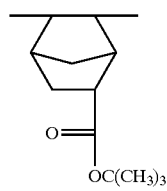

bicyclo[2.2.1]heptane-2-carboxylic acid tert-butyl ester (TBNB).

A representative example of formula (II) is

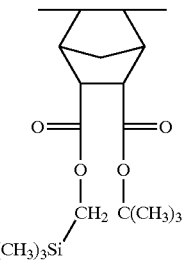

5norbornene-2,3-dicarboxylic acid tert-butyl ester (trimethylsilyl) methyl ester (TMSTBNB).

A representative example of formula (III) is

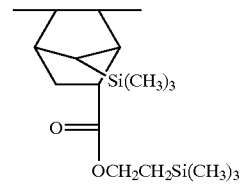

trimethylsilanyl-bicyclo[2.2.1]heptane-2-carboxylic acid 2-trimethylsilanyl-ethyl ester (DITSNB).

A representative example of formula (IV) is

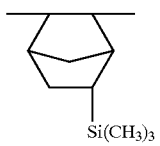

2-trimethylsilyl-5-norbornene (TSNB).

A representative example of formula (V) is

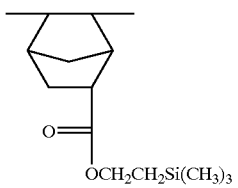

bicyclo[2.2.1]heptane-2-carboxylic acid 2-trimethylsilanyl-ethyl ester (TSENB).

According to the present invention, $R^1$, $R^2$, $R^3$, and $R^6$ can be the same or different and can be acid-labile protective groups, which decompose in the presence of an acid, so as to make the silicon-containing copolymer alkali-soluble.

When $R^1$, $R^2$, $R^3$, and R are acid-labile protective groups, the acid-labile protective group can be selected from the group consisting of:

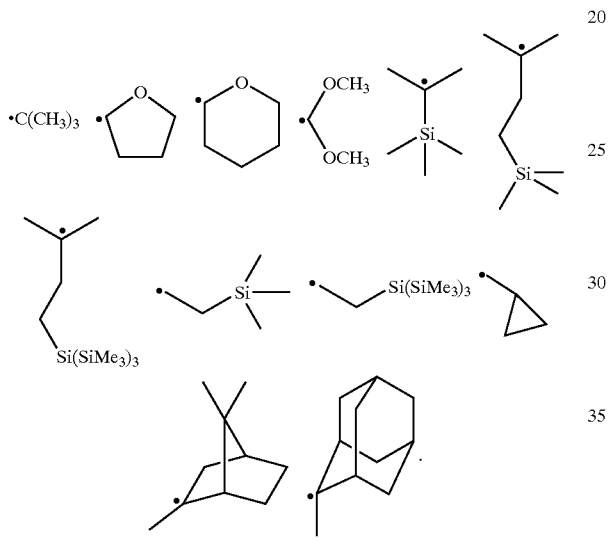

$R^7$ can also be an acid-labile protective group, which decomposes in the presence of an acid, so as to make the silicon-containing copolymer alkali-soluble. When $R^7$ is the acid-labile protective group, the acid-labile protective group can be selected from the group consisting of:

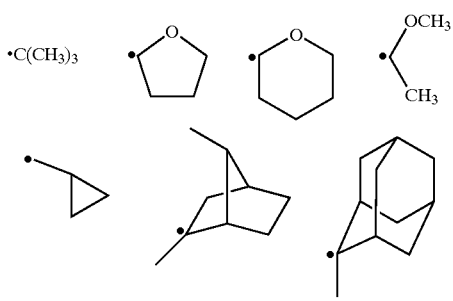

The silicon-containing copolymer of the present invention can be soluble in an organic solvent, and has a weight average molecular weight (Mw) of 1000 to 5000 and a glass transition temperature (Tg) of 70° C. to 150° C. In addition, the silicon-containing copolymer of the present invention can be used as a top layer resist in a bilayer resist system.

The present invention also provides a photosensitive resin composition, which comprises:

(a) a silicon-containing copolymer including a repeating unit represented by formula (I), a repeating unit represented by formula (VI), a repeating unit represented by a formula selected from the group consisting of formulae (II), (III), (IV), (V), and mixtures thereof:

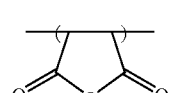
(I)

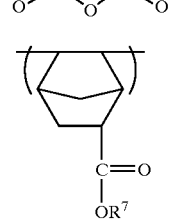
(VI)

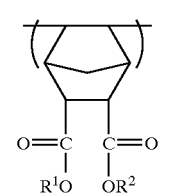
(II)

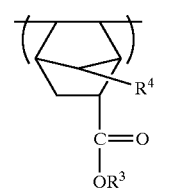
(III)

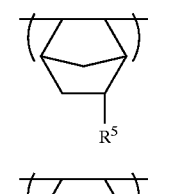
(IV)

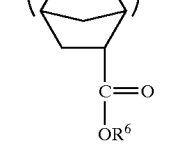
(V)

wherein $R^7$ is selected from the group consisting of hydrogen, $C_{1-20}$ linear and branched alkyl, ($C_{1-6}$alkoxy) ($C_{1-10}$ alkyl), ($C_{3-20}$cycloalkyl) ($C_{0-6}$alkyl), ($C_{3-20}$ polycycloalkyl) ($C_{0-6}$alkyl), and ($C_{3-10}$heterocyclic group) ($C_{0-6}$alkyl), $R^1$, $R^2$, and $R^3$ can be the same or different and are independently selected from the group consisting of hydrogen, $C_{1-20}$ linear and branched alkyl, ($C_{1-6}$ alkoxy) ($C_{1-10}$alkyl), ($C_{3-20}$cycloalkyl) ($C_{0-6}$alkyl), ($C_{3-20}$polycycloalkyl) ($C_{0-6}$alkyl), ($C_{3-10}$heterocyclic group) ($C_{0-6}$alkyl), and a silicon-containing group, wherein the silicon-containing group is $C_{3-50}$ silyl or ($C_{3-50}$silyl) ($C_{1-9}$alkyl), and the silyl can be substituted with an alkoxy substituent, and wherein at least one of $R^1$ and $R^2$ is the silicon-containing group, $R^4$, $R^5$, and $R^6$ can be the same or different and are independently the silicon-containing group, and the moles of formula (I), the moles of formula (VI), and the sum of the moles of formulae (II), (III), (IV), and (V) are in a ratio of 1:0.05–0.8:0.2–0.95;

(b) 0.03–10 wt % of a photoacid generator; and (c) 5–20 wt % of a solvent, based on the weight of the silicon-containing copolymer.

Any suitable photoacid generator may be used. Preferred photoacid generators include, but are not limited to, triarylsulfonium salts, diaryliodonium salts, sulfonates, and mixtures thereof. Representative examples of the triarylsulfonium salts include triphenylsulfonium triflate, triphenylsulfonium antimonate, tris-4-methoxyphenylsulfonium triflate, tris-4-methoxyphenylsulfonium antimonate, tris-4-methylphenylsulfonium triflate, and 1-naphthyl methyl-substituted alkylsulfonium triflate. Representative examples of the diaryliodonium salts include diphenyliodonium triflate, di-t-butylphenyliodonium antimonate, and di-t-butylphenyliodonium antimonate.

Suitable solvents can be ethers, ethylene diol ethers, aromatic hydrocarbons, ketones, esters, or mixtures thereof.

The photosensitive resist composition of the present invention can further include (d) a killer base in an amount of 1–20 mole % based on the mole of (c) photoacid generator. The killer base can be an amine or an ammonium salt, for example, a trialkyl amine or a tetraalkyl substituted ammonium salt.

The photosensitive resist composition of the present invention can be photosensitive at a wavelength of UV, deep UV, vacuum UV (300 nm–100 nm), extreme UV (11 nm–13 nm), electron-beam, or X-ray, preferably at a wavelength of 193 nm or 153 nm.

The photosensitive resin composition of the present invention can be used as a top layer in a bilayer resist system. First, a resin underlayer is coated on a silicon wafer and then cured by baking. Next, the photosensitive resin composition of the present invention, which includes the silicon-containing copolymer, is coated on the silicon wafer with the resin underlayer and then baked to form a top layer.

The wafer, which has been coated with the resin underlayer and the silicon-containing top resist layer, is exposed to radiation through a mask and then baked. Upon exposure, the acid-labile group in the silicon-containing copolymer of the present invention is removed. Thus, the exposed region of the top layer can be removed by developing the wafer with a conventional developer. Thus, a pattern of the top layer can be formed.

The patterned wafer is then subjected to oxygen plasma etching. In the unexposed region, silicon contained in the surface of the top layer will react with oxygen plasma to form nonvolatile products (i.e., $SiO_2$). In the exposed region, the underlayer will react with oxygen plasma to form volatile products and will be readily evaporated by etching. Therefore, the pattern of the silicon-containing resist top layer can be transferred to the resin underlayer accordingly.

With regard to the resin underlayer, the resin suitable for use in the present invention can be phenolic resins, particularly novolak resins, such as formaldehyde cresol or formaldehyde phenol novolaks, polyimide resins, poly(meth)acrylate resins and styrene-allyl alcohol copolymer resins.

The present invention provides a novel silicon-containing copolymer having a high glass transition temperature and a better polarity. The silicon-containing copolymer of the present invention can be used in a bilayer resist system and has good adhesion to a resin underlayer.

The following examples are intended to illustrate the process and the advantages of the present invention more fully without limiting its scope, since numerous modifications and variations will be apparent to those skilled in the art.

Preparation of Silicon-containing Copolymer

EXAMPLE 1

Resin A 0.020 mole of maleic anhydride (MA), 0.012 mole of t-butyl 5-norbornene-2-carboxylate (TBNB), and 0.008 mole of 2-trimethylsilyl-5-norbornene (TSNB) were dissolved in 6 ml of tetrahydrofuran (THF), and the solution was then transferred into a 50 ml 3-neck flask. The solution was stirred and heated to 70° C. 0.0012 mole of dimethyl 2,2'-azobisisobutyrate (V-601, initiator) was dissolved in 2 ml THF and was then added to the above-mentioned solution. The solution mixture was stirred at 70° C. for 10 hours. The reaction solution was then dropped in a mixed solution of a large amount of methanol and water for precipitation. The mixture was filtered, and dried under vacuum at 50° C. for 12 hours. The yield was 95%.

The silicon-containing copolymer obtained has a weight average molecular weight (Mw) of 2298 determined by GPC (WATERS Model 600), a glass transition temperature (Tg) of 156° C. and a decomposition temperature (Td) of 199° C. determined by DSC (PERKIN ELMER DSC7) and TGA (PERKIN ELMER TGA7).

EXAMPLE 2

Resin B 0.020 mole of maleic anhydride (MA), 0.010 mole of t-butyl 5-norbornene-2-carboxylate (TBNB), and 0.010 mole of 2-trimethylsilyl-5-norbornene (TSNB) were dissolved in 6 ml of tetrahydrofuran (THF), and the solution was then transferred into a 50 ml 3-neck flask. The solution was stirred and heated to 70° C. 0.0012 mole of dimethyl 2,2'-azobisisobutyrate (V-601, initiator) was dissolved in 2 ml THF and was then added to the above-mentioned solution. The solution mixture was stirred at 70° C. for 10 hours. Then, the reaction solution was dropped in a mixed solution of a large amount of methanol and water for precipitation. The mixture was filtered, and dried under vacuum at 50° C. for 12 hours. The yield was 92%.

The silicon-containing copolymer obtained has a Mw of 2066 determined by GPC (WATERS Model 600), a Tg of 123° C. and a Td of 209° C. determined by DSC (PERKIN ELMER DSC7) and TGA (PERKIN ELMER TGA7).

EXAMPLE 3

Resin C 0.020 mole of maleic anhydride (MA), 0.002 mole of t-butyl 5-norbornene-2-carboxylate (TBNB), 0.002 mole of 2-trimethylsilyl-5-norbornene (TSNB), and 0.016 mole of 2-t-butyl 3-trimethylsilylmethyl 5-norbornene-2,3-dicarboxylate (TMSTBNB) were dissolved in 16 ml of THF, and the solution was then transferred into a 100 ml 3-neck flask. The solution was stirred and heated to 70° C. 0.0020 mole of dimethyl 2,2'-azobisisobutyrate (V-601, initiator) was dissolved in 2 ml THF and then added to the above-mentioned solution. The solution mixture was stirred at 70° C. for 10 hours. The reaction solution was then dropped in a mixed solution of a large amount of methanol and water for precipitation. The mixture was filtered, and dried under vacuum at 50° C. for 12 hours. The yield was 30%.

The silicon-containing copolymer obtained has a Mw of 1572 determined by GPC (WATERS Model 600), a Tg of 92° C. and a Td of 212.3° C. determined by DSC (PERKIN ELMER DSC7) and TGA (PERKIN ELMER TGA7).

EXAMPLE 4

Resin D 0.040 mole of maleic anhydride (MA), 0.016 mole of t-butyl 5-norbornene-2-carboxylate (TBNB), 0.016 mole of 2-trimethylsilyl-5-norbornene (TSNB), and 0.008 mole of 2-t-butyl 3-trimethylsilylmethyl 5-norbornene-2,3-dicarboxylate (TMSTBNB) were dissolved in 12 ml of THF, and the solution was then transferred into a 50 ml 3-neck flask. The solution was stirred and heated to 70° C. 0.004 mole of dimethyl 2,2'-azobisisobutyrate (V-601, initiator) was dissolved in 4 ml THF and then added to the above-mentioned solution. The solution mixture was stirred at 70° C. for 10 hours. The reaction solution was then dropped in a mixed solution of a large amount of methanol and water for precipitation. The mixture was filtered, and dried under vacuum at 50° C. for 12 hours. The yield was 58%.

The silicon-containing copolymer obtained has a Mw of 1840 determined by GPC (WATERS Model 600), a Tg of 96.2° C. and a Td of 238.5° C. determined by DSC (PERKIN ELMER DSC7) and TGA (PERKIN ELMER TGA7).

EXAMPLE 5

Resin E 0.040 mole of maleic anhydride (MA), 0.016 mole of t-butyl 5-norbornene-2-carboxylate (TBNB), 0.020 mole of 2-trimethylsilyl-5-norbornene (TSNB), and 0.004 mole of 2-t-butyl 3-(trimethylsilyl)methyl 5-norbornene-2,3-dicarboxylate (TMSTBNB) were dissolved in 12 ml of THF, and the solution was then transferred into a 50 ml 3-neck flask. The solution was stirred and heated to 70° C. 0.004 mole of dimethyl 2,2'-azobisisobutyrate (V-601, initiator) was dissolved in 4 ml THF and then added in the above-mentioned solution. The solution mixture was stirred at 70° C. for 10 hours and then dropped in a mixed solution of a large amount of methanol and water for precipitation. The mixture was filtered, and dried under vacuum at 50° C. for 12 hours. The yield was 76%. The silicon-containing copolymer obtained has a Mw of 1835 determined by GPC (WATERS Model 600), a Tg of 98.6° C. and a Td of 231.5° C. determined by DSC (PERKIN ELMER DSC7) and TGA (PERKIN ELMER TGA7).

EXAMPLE 6

Resin F 0.020 mole of maleic anhydride (MA), 0.004 mole of t-butyl 5-norbornene-2-carboxylate (TBNB), 0.010 mole of 2-trimethylsilyl-5-norbornene (TSNB), and 0.006 mole of (2-trimethylsilyl)ethyl 5-norbornene-2-carboxylate (TSENB) were dissolved in 6 ml of THF, and the solution was then transferred into a 100 ml 3-neck flask. The solution was stirred and heated to 70° C. 0.002 mole of dimethyl 2,2'-azobisisobutyrate (V-601, initiator) was dissolved in 2 ml THF and then added in the above-mentioned solution. The solution mixture was stirred at 70° C. for 10 hours. The reaction solution was then dropped in a mixed solution of a large amount of methanol and water for precipitation. The mixture was filtered, and dried under vacuum at 50° C. for 12 hours. The yield was 88%.

The silicon-containing copolymer obtained has a Mw of 2550 determined by GPC (WATERS Model 600), a Tg of 131.5° C. and a Td of 183.5° C. determined by DSC (PERKIN ELMER DSC7) and TGA (PERKIN ELMER TGA7).

EXAMPLE 7

Resin G 0.040 mole of maleic anhydride (MA), 0.0064 mole of t-butyl 5-norbornene-2-carboxylate (TBNB), and 0.0344 mole of (2-trimethylsilyl)ethyl 5-norbornene-2-carboxylate (TSENB) were dissolved in 14 ml of THF, and the solution was then transferred into a 100 ml 3-neck flask. The solution was stirred and heated to 70° C. 0.004 mole of dimethyl 2,2'-azobisisobutyrate (V-601, initiator) was dissolved in 4 ml THF and then added to the above-mentioned solution. The solution mixture was stirred at 70° C. for 10 hours and then dropped in a mixed solution of a large amount of methanol and water for precipitation. The mixture was filtered, and dried under vacuum at 50° C. for 12 hours. The yield was 97%.

The silicon-containing copolymer obtained has a Mw of 2714 determined by GPC (WATERS Model 600), a Tg of 112.7° C. and a Td of 176.6° C. determined by DSC (PERKIN ELMER DSC7) and TGA (PERKIN ELMER TGA7).

EXAMPLE 8

Resin H 0.040 mole of maleic anhydride (MA), 0.016 mole of t-butyl 5-norbornene-2-carboxylate (TBNB), 0.016 mole of 2-trimethylsilyl-5-norbornene (TSNB), and 0.008 mole of (2-trimethylsilyl)ethyl 7-syn-(trimethylsilyl)5-norbornene-2-carboxylate (DITSNB) were dissolved in 12 ml of THF, and the solution was then transferred into a 50 ml 3-neck flask. The solution was stirred and heated to 70° C. 0.004 mole of dimethyl 2,2'-azobisisobutyrate (V-601, initiator) was dissolved in 4 ml THF and then added to the above-mentioned solution. The solution was stirred at 70° C. for 10 hours and then dropped in a mixed solution of a large amount of methanol and water for precipitation. The mixture was filtered, and dried under vacuum at 50° C. for 12 hours. The yield was 50%.

The silicon-containing copolymer obtained has a Mw of 2409 determined by GPC (WATERS Model 600), a Tg of 143.0° C. and a Td of 225.0° C. determined by DSC (PERKIN ELMER DSC7) and TGA (PERKIN ELMER TGA7).

EXAMPLE 9

Resin I 0.020 mole of maleic anhydride (MA), 0.006 mole of t-butyl 5-norbornene-2-carboxylate (TBNB), and 0.014 mole of 2-t-butyl 3-trimethylsilylmethyl 5-norbornene-2,3-dicarboxylate (TMSTBNB) were dissolved in 16 ml of THF, and the solution was then transferred into a 50 ml 3-neck flask. The solution was stirred and heated to 70° C. 0.004 mole of dimethyl 2,2'-azobisisobutyrate (V-601, initiator) was dissolved in 4 ml THF and then added to the above-mentioned solution. The solution mixture was stirred at 70° C. for 10 hours and then dropped in a mixed solution of a large amount of methanol and water for precipitation. The mixture was filtered, and dried under vacuum at 50° C. for 12 hours.

The silicon-containing copolymer obtained has a Mw of 1580 determined by GPC (WATERS Model 600), a Tg of 113.1° C. and a Td of 208.7° C. determined by DSC (PERKIN ELMER DSC7) and TGA (PERKIN ELMER TGA7).

Preparation of Silicon-containing Resist 1.7 g of the silicon-containing copolymer obtained from Examples 1–9, 0.0519 of triphenylsulfonium nonafluorosulfate (PAG; photoacid generator), 0.0012 g of 1-piperidine ethanol (killer base) and 11 g of propylene glycol methyl ether acetate (PGMEA) were mixed and stirred for 1 day. The mixture was filtered through a 0.2 μm PTFE filter.

Coating of the Resin Underlayer 2.5 ml of PFI38A9 resist (available from Sumitomo) was spin-coated on an 8-inch wafer using a Polaris 2000 Microlithography Cluster Coater at 4000 rpm. The wafer was baked at 250° C. for 2 minutes to generate thermal curing. Then, the wafer was cooled to 23° C. and a resin underlayer of 7000 Å thick was obtained.

Photolithographic Evaluation of the Silicon-containing Resist 2 ml of the silicon-containing resist obtained was spin formed on the silicon wafer with the resin underlayer at 3000 rpm and baked at 130° C. for 90 seconds. Then, the wafer was cooled to 23° C. and a top silicon-containing resist layer of 2000 Å was obtained. The formed wafer was exposed through a mask using a 0.6 NA ISI 193 nm Stepper and then post-exposure baked at 120° C.–150° C. for 90 seconds. The wafer was then cooled to 23° C. and developed for 60 seconds using 0.262 N tetramethylammonium hydroxide (TMAH) solution. The wafer was then rinsed with distilled water and spin dried to form a resist pattern. It was confirmed by scanning electron microscopy (SEM) that the resist could resolve line-and-space patterns (L/S patterns) less than 0.15 μm. The silicon-containing resist top layer and resin underlayer showed good film forming properties and adhesion. The formed wafer had high photosensitive properties and the dose-to-clear energy ($E_0$) was 3–20 mJ/cm².

Dry Etching

The pattern of the silicon-containing resist top layer was transferred to the resin underlayer by dry etching using a TCP9400 etcher available from Lam Research Company. The dry etching conditions were: 500 W (Source), 75 W (Bias), −10° C., 10 mT pressure, 20 sccm $O_2$ flow, 30 sccm $SO_2$ flow, and 30 seconds. Images from SEM after etching showed that the wall angle was larger than 87° and the resist could resolve line-and-space patterns (L/S patterns) less than 0.25–0.13 μm. Other results included OD (optical density), $E_{th}$, and DE (dark erosion), which are shown in Table 1.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A silicon-containing copolymer comprising a repeating unit represented by formula (I), a repeating unit represented by formula (VI), and a repeating unit represented by formula (II):

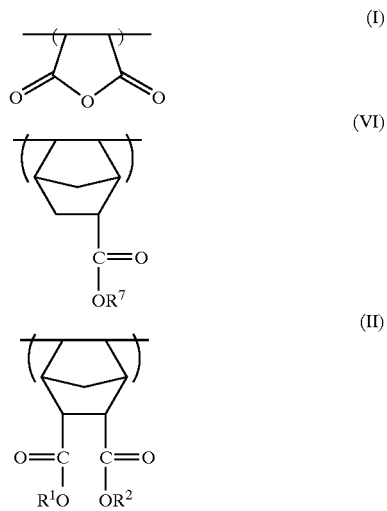

wherein, $R^7$ is selected from the group consisting of hydrogen, $C_{1-20}$ linear and branched alkyl, ($C_{1-6}$alkoxy)($C_{1-10}$alkyl), ($C_{3-20}$cycloalkyl)($C_{0-6}$alkyl), ($C_{3-20}$polycycloalkyl)($C_{0-6}$alkyl), and ($C_{3-10}$heterocyclic group) ($C_{0-6}$alkyl), $R^1$ and $R^2$ are the same or different and at least one of $R^1$ and $R^2$ is a silicon-containing group, and the other is selected from the group consisting of $C_{1-20}$ linear and branched alkyl, ($C_{1-6}$alkoxy) ($C_{1-10}$alkyl), ($C_{3-}$

TABLE 1

Compositions of Resins A-I and Properties of their Resists

| Resin | Resin A | Resin B | Resin C | Resin D | Resin E | Resin F | Resin G | Resin H | Resin I |
|---|---|---|---|---|---|---|---|---|---|
| TBNB | 30% | 25% | 5% | 20% | 20% | 10% | 7.9% | 20% | 15% |
| MA | 50% | 50% | 50% | 50% | 50% | 50% | 49.5% | 50% | 50% |
| TSNB | 20% | 25% | 5% | 20% | 25% | 25% | — | 20% | — |
| TMSTBNB | — | — | 40% | 10% | 5% | — | — | — | 35% |
| TSENB | — | — | — | — | — | 15% | 42.6% | — | — |
| DITSNB | — | — | — | — | — | — | — | 10% | — |
| PEB (° C.) | 140 | 130 | 110 | 130 | 140 | 130 | 130 | 150 | 130 |
| OD (μm⁻¹) | 0.5542 | 0.5734 | 0.6519 | — | — | 0.5996 | 0.6771 | — | 0.5948 |
| $E_{th}$ (mJ/cm²) | 5.5 | 8.5 | 10.5 | 11.0 | 8.5 | 8.5 | 7.0 | 11.0 | 8.0 |
| DE (Å/min) | −18 | −15 | −10 | −12 | −9 | −12 | −15 | −12 | −65 |
| CD (μm) | 0.13 | 0.19 | 0.13 | 0.14 | 0.14 | 0.25 | 0.15 | 0.13 | — |

$_{20}$cycloalkyl) ($C_{0-6}$alkyl), ($C_{3-20}$polycycloalkyl) ($C_{0-6}$alkyl), and ($C_{3-10}$heterocyclic group) ($C_{0-6}$alkyl), wherein the silicon-containing group is $C_{3-50}$ silyl or $(C_{3-50}silyl)(C_{1-9}alkyl)$, and the silyl can be substituted with an alkoxy substituent, and the moles of formula (I), the moles of formula (VI), and the moles of formula (II) are in a ratio of 1:0.05–0.08:0.2–0.95.

2. The silicon-containing copolymer as claimed in claim 1, wherein the silicon-containing group is selected from the group consisting of

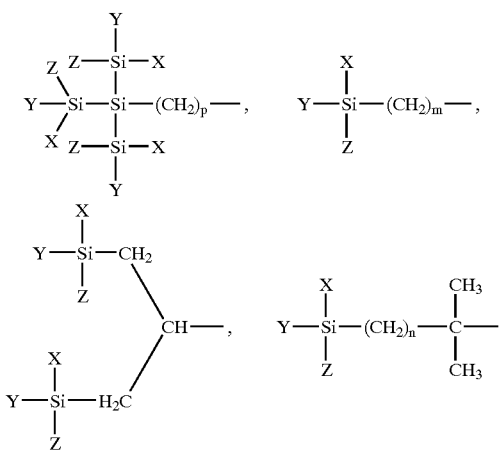

wherein

X, Y, and Z are the same or different and are independently selected from the group consisting of $C_{1-4}$ linear and branched alkyl, and $C_{1-6}$ alkoxy, m, n, and p are 0 or integers of from 1 to 6.

3. The silicon-containing copolymer as claimed in claim 2, wherein X, Y, and Z are the same and are methyl or methoxy.

4. The silicon-containing copolymer as claimed in claim 3, wherein the silicon-containing group is selected from the group consisting of

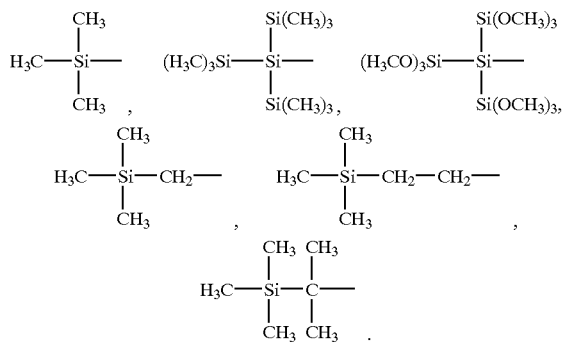

5. The silicon-containing copolymer as claimed in claim 1, wherein $R^7$ is the acid-labile protective group, which decomposes in the presence of an acid, so as to make the silicon-containing copolymer alkali-soluble.

6. The silicon-containing copolymer as claimed in claim 5, wherein the acid-labile protective group is selected from the group consisting of

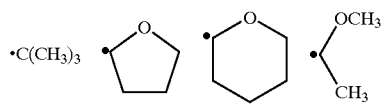

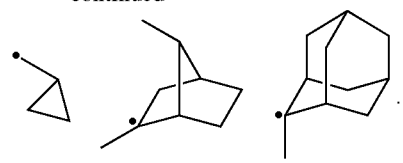

7. The silicon-containing copolymer as claimed in claim 1, wherein the copolymer is soluble in an organic solvent and has a weight average molecular weight (Mw) of 1000 to 5000.

8. The silicon-containing copolymer as claimed in claim 1, wherein the copolymer has a glass transition temperature (Tg) of 70° C. to 150° C.

9. The silicon-containing copolymer as claimed in claim 1, wherein the copolymer is used as a top layer resist in a bilayer resist system.

10. The silicon-containing copolymer as claimed in claim 1, wherein in formula (II), $R^1$ and $R^2$ are different and one of $R^1$ and $R^2$ is the silicon-containing group, and the other is selected from the group consisting of $C_{1-20}$ linear and branched alkyl, $(C_{1-6}$ alkoxy$)(C_{1-0}$ alkyl$)$, $(C_{3-20}$cycloalkyl$)$ $(C_{0-6}$alkyl$)$, $(C_{3-20}$polycycloalkyl$)$ $(C_{0-6}$alkyl$)$, and $(C_{3-10}$ heterocyclic group$)$ $(C_{0-6}$alkyl$)$.

11. The silicon-containing copolymer as claimed in claim 10, wherein formula (II) is:

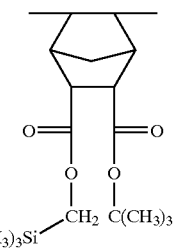

5-norbornene-2,3-dicarboxylic acid tert-butyl ester (trimethylsilyl) methyl ester.

12. The silicon-containing copolymer as claimed in claim 1, further comprising a repeating unit represented by a formula selected from the group consisting of formulae (III), (IV), (V), and mixtures thereof:

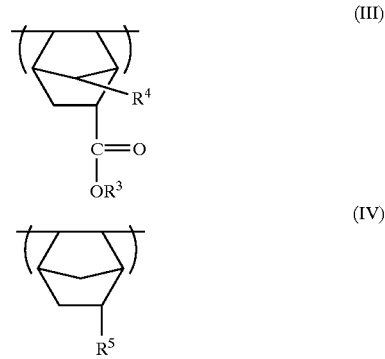

-continued

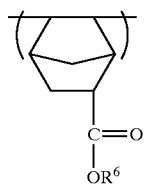
(V)

wherein
R³ is selected from the group consisting of hydrogen, $C_{1-20}$ linear and branched alkyl, ($C_{1-6}$alkoxy) ($C_{1-10}$ alkyl), ($C_{3-20}$cycloalkyl) ($C_{0-6}$alkyl), ($C_{3-20}$ polycycloalkyl) ($C_{0-6}$alkyl), ($C_{3-10}$heterocyclic group) ($C_{0-6}$alkyl), and the silicon-containing group, R₄, R₅, and R₆ are the same or different and are independently the silicon-containing group, and the moles of formula (I), the moles of formula (VI), and the sum of the moles of formulae (II), (III), (IV), and (V) are in a ratio of 1:0.05–0.8:0.2–0.95.

13. The silicon-containing copolymer as claimed in claim 12, wherein formula (III) is:

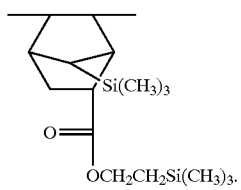

14. The silicon-containing copolymer as claimed in claim 12, wherein formula (IV) is:

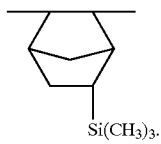

15. The silicon-containing copolymer as claimed in claim 12, wherein formula (V) is:

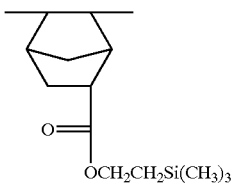

bicyclo [2.2.1]heptane-2-carboxylic acid 2-trimethylsilanyl-ethyl ester.

16. The silicon-containing copolymer as claimed in claim 12, wherein R¹, R², R³, and R⁶ are the same or different and are acid-labile protective groups, which decompose in the presence of an acid, so as to make the silicon-containing copolymer alkali-soluble.

17. The silicon-containing copolymer as claimed in claim 16, wherein the acid-labile protective group is selected from the group consisting of

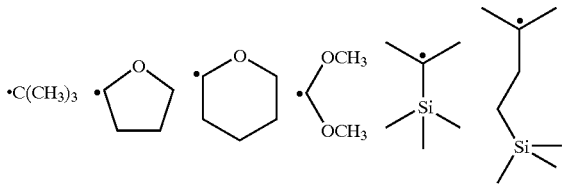

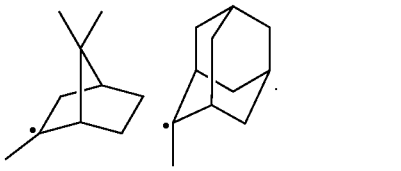

18. The silicon-containing copolymer as claimed in claim 1, wherein formula (VI) is:

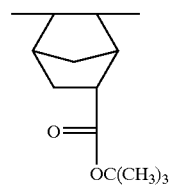

bicyclo [2.2.1] heptane-2-carboxylic acid tert-butyl ester.

19. A photosensitive resin composition comprising:
(a) the silicon-containing copolymer as claimed in claim 1;
(b) 0.03–10 wt % of a photoacid generator; and
(c) 5–20 wt % of a solvent, based on the weight of the silicon-containing copolymer.

20. The photosensitive resist composition as claimed in claim 19, wherein the photoacid generator is selected from the group consisting of triarylsulfonium salts, diaryliodonium salts, sulfonates, and mixtures thereof.

21. The photosensitive resist composition as claimed in claim 19, further comprising (d) a killer base in an amount of 1–20 mole % based on the mole of (c) photoacid generator.

22. The photosensitive resist composition as claimed in claim 21, wherein the killer base is an amine or an ammonium salt.

23. The photosensitive resist composition as claimed in claim 19, wherein the composition is photosensitive at a wavelength of UV, deep UV, vacuum UV (300 nm–100 nm), extreme UV (11 nm–13 nm), electron-beam, or X-ray.

24. The photosensitive resist composition as claimed in claim 19, wherein the composition is photosensitive at a wavelength of 193 nm or 153 nm.

* * * * *